United States Patent [19]
Nishimura et al.

[11] Patent Number: 6,144,051
[45] Date of Patent: *Nov. 7, 2000

[54] SEMICONDUCTOR DEVICE HAVING A METAL-INSULATOR-METAL CAPACITOR

[75] Inventors: Takeshi B Nishimura; Naotaka Iwata, both of Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/087,159

[22] Filed: May 29, 1998

[30] Foreign Application Priority Data

May 30, 1997 [JP] Japan ..................................... 9-142178

[51] Int. Cl.$^7$ ..................................... H01L 27/02
[52] U.S. Cl. ..................... 257/277; 257/306; 257/310
[58] Field of Search ..................... 257/296, 306, 257/310, 277

[56] References Cited

U.S. PATENT DOCUMENTS 5,561,307 10/1996 Mihara et al. ........................... 257/310
5,624,864 4/1997 Arita et al. ................................... 437/3
5,670,808 9/1997 Nishihori et al. ........................ 257/310
5,721,700 2/1998 Katoh ....................................... 257/296
5,818,079 10/1998 Noma et al. ............................ 257/310

FOREIGN PATENT DOCUMENTS

| 3-136362 | 6/1991 | Japan . |
| 5-343615 | 12/1993 | Japan . |
| 6-125058 | 5/1994 | Japan . |
| 6-314768 | 11/1994 | Japan . |
| 7-235639 | 9/1995 | Japan . |
| 8-236719 | 9/1996 | Japan . |

*Primary Examiner*—Gene M. Munson
*Attorney, Agent, or Firm*—Hutchins, Wheeler & Dittmar

[57] ABSTRACT

A method for manufacturing a semiconductor device having a metal-insulator-metal (MIM) capacitor comprises the steps of forming a first dielectric film on a substrate, forming a MIM capacitor on the first dielectric film, forming a second dielectric film covering the MIM capacitor, selectively removing the first and second dielectric films to expose the substrate surface, surface treating using a hydrochloric acid solution, forming a third dielectric film on the second dielectric film and the substrate, and forming a transistor on the third dielectric film. The second dielectric film protects the capacitor insulator film of the MIM capacitor.

8 Claims, 8 Drawing Sheets

SEMICONDUCTOR DEVICE HAVING A METAL-INSULATOR-METAL CAPACITOR

BACKGROUND OF THE INVENTION (a) Field of the Invention

The present invention relates to a semiconductor device comprising a metal-insulator-metal (MIM) capacitor having a high permittivity film for use in a microwave range, and a method for fabricating such a semiconductor device.

(b) Description of the Related Art

A MIM capacitor is known which comprises a high permittivity film, i.e., a thin film having a high dielectric constant, such as made of $BaTiO_3$, $SrTiO_3$, $(Sr_x,Ba_{1-x})TiO_3$, $PbTiO_3$, $Pb(Zr_x,Ti_{1-x})O_3$ and $SrBi_2Ti_{2-x}Nb_xO_9$, and has an advantage of high capacitance per unit area. The MIM capacitor is generally used in a high density integrated circuit, such as a memory device, for use in a microwave range. Such a capacitor having a $SrTiO_3$ film, for example, is reported in "IBM Journal of Research and Development", Nov. 1969, pp686–695. It is reported that, among others, sputtered $SrTiO_3$ and $(Sr_x,Ba_{1-x})TiO_3$ films are especially useful because these films can be formed below 650° C. which is the decomposition temperature of a GaAs substrate.

A conventional process for manufacturing a semiconductor device having a MIM capacitor and a FET or active element generally comprises the step of forming a FET or active element after the step of forming the MIM capacitor having a bottom electrode, a capacitor insulator film and a top electrode. In some cases, an additional process film, such as an insulator film, for forming thereon interconnections may be formed before forming the FET or bipolar transistor. The through-holes for the top and bottom electrodes are generally formed by a single step using a mixed gas of $CHF_3$ and $H_2$. To obtain perfect through-holes, over-etching by 100% is generally used wherein the etching time is double the normal time length considered to be sufficient for etching through-hole for exposing the bottom electrode.

In a conventional semiconductor device having such a MIM capacitor, contamination in the transistor (FET) regions is sometimes observed due to the impurity elements and alkaline-earth metals which ate eluded from the high permittivity film during pretreatment of substrate surface by using a hydrochloric acid solution before formation of the process film, resulting in degradation of FET characteristics.

In addition, a high substrate temperature during formation of a high permittivity film causes leakage current in substrate, which retards the sufficient insulation between the active elements. Moreover, the bottom electrode disposed in contact with the substrate defines the configuration of the circuit including the capacitor to thereby limit the design choice of the circuit. Further, the 100% over-etching for the bottom electrode causes 200–400% over-etching for the top electrode, which damages the high-permittivity film and the top electrode due to the ion damage or reducing gas, resulting in a higher leakage current in the MIM capacitor.

SUMMARY OF THE INVENTION

It is an object of the present invention to provide a semiconductor device having a MIM capacitor capable of being formed with less contamination in the active element region and having an excellent leakage current characteristic.

It is another object of the present invention to provide a method for manufacturing such a semiconductor device.

The present invention provides a semiconductor device comprising a substrate, a metal-insulator-metal (MIM) capacitor overlying the substrate and having a bottom electrode, capacitor insulator film and a top electrode, a first dielectric film covering the MIM capacitor and having an edge protruding from an edge of the bottom electrode, a second dielectric film formed on the first dielectric film and the substrate, the second dielectric film having a first opening for exposing a portion of the substrate, and a transistor having an electrode in contact with the portion of the substrate through the first opening.

The present invention also provides a method for manufacturing a semiconductor device comprising the steps of forming a metal-insulator-metal (MIM) capacitor overlying a substrate and having a bottom electrode, a capacitor insulator film and a top electrode, forming a first dielectric film covering the MIM capacitor and having an edge protruding from an edge of the bottom electrode, forming a second dielectric film on the first dielectric film and the substrate, the second dielectric film having a first opening for exposing a portion of the substrate, and forming a transistor having an electrode in contact with the portion of the substrate via the first opening.

In accordance with the semiconductor device of the present invention or fabricated by the method of the present invention, contamination in the transistor region from the MIM capacitor can be suppressed by the first dielectric film covering the MIM capacitor, especially during a pretreatment of the substrate surface.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1A:
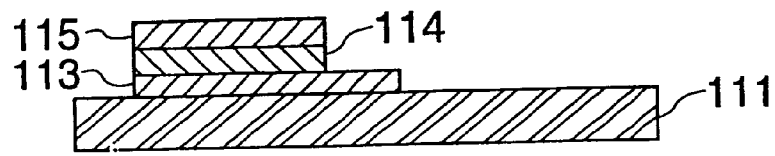
FIGS. 1A to 1E are cross-sectional views of a semiconductor device in consecutive steps of a fabrication process thereof according to a first embodiment of the present invention.
Figure 1B:
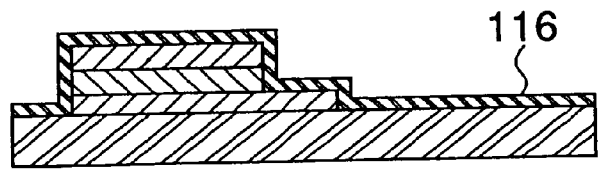

Referring to FIGS. 1A to 1E, there is shown a process according to a first embodiment of the present invention. For fabrication of the first embodiment, a bottom electrode 113 made of a laminate including Pt(70 nm)/Ti(20 nm)/Pt(70 nm)/Ti(20 nm) films as viewed from the top to the bottom, a 200 nm-thick high-permittivity film 114 made of $SrTiO_3$ and a 70 nm-thick top electrode 115 made of Pt were consecutively formed on a GaAs substrate 111 by sputtering and subsequent ion-milling steps to obtain a MIM capacitor, as shown in FIG. 1A. The substrate temperature during the formation of $SrTiO_3$ film was about 320° C. On the MIM capacitor, a 100 nm-thick $SiO_2$ 116 film was formed by atmospheric pressure chemical vapor deposition (APCVD), as shown in FIG. 1B.

Figure 1C:
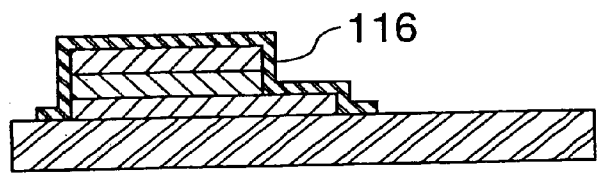
Figure 1D:
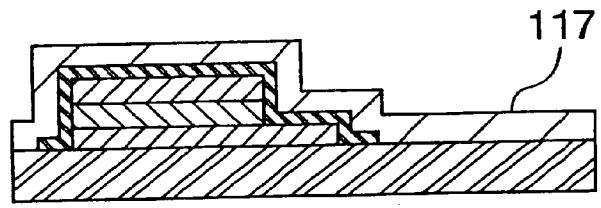
Figure 1E:
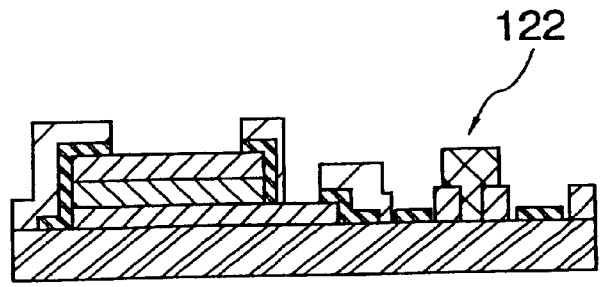

Subsequently, the $SiO_2$ film 116 was selectively removed by a wet etching process using a photoresist film as a mask to leave the $SiO_2$ film 116 covering the MIM capacitor and having an outer edge protruding 5 μm from the edge of the bottom electrode 113, as shown in FIG. 1C. After treating the surface of the resultant wafer by using a hydrochloric solution ($HCl:H_2O$=1:1), a process oxide film 117 was formed by a low pressure CVD (LPCVD) technique, as shown in FIG. 1D, followed by formation of gate electrode and ohmic contacts while patterning the process oxide film 117 to form a FET 122, as shown in FIG. 1E.

The resultant FET was subjected to measurement of drain current characteristic with respect to drain voltage. In the measurement, the FET according to the present embodiment had excellent characteristics of a maximum drain current density at 630 mA/mm and a maximum drain conductance at 340 mS/mm. This result is considered due to the fact that $SiO_2$ film covering the MIM capacitor prevented Sr element or impurity elements from eluding from the $SrTiO_3$ film during the pretreatment of the substrate surface by using the hydrochloric acid solution before formation of the process oxide film 117. On the other hand, in the conventional semiconductor device having a MIM capacitor, Sr element and impurity elements eluded from the $SrTiO_3$ film are considered to form deep energy levels in the GaAs substrate, thereby degrading the maximum drain current density and the maximum drain conductance by about 5 to 50%.

In the present embodiment, the GaAs substrate may be replaced by an InP substrate or Si substrate. In addition, the high-permittivity film may be made of $BaTiO_3$, $(Sr_x, Ba_{1-x})TiO_3$, $PbTiO_3$, $Pb(Zr_x, Ti_{1-x})O_3$, $SrBi_2Ti_{2-x}Nb_xO_9$ to obtain a FET having a similar characteristics.

Figure 2A:
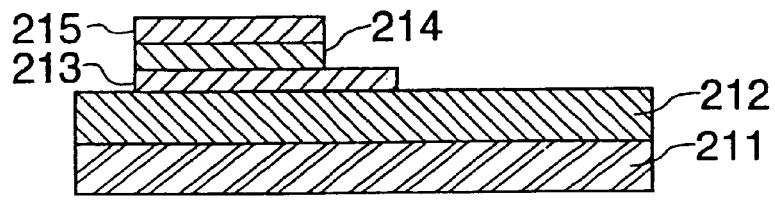
FIGS. 2A to 2E are cross-sectional views of a semiconductor device in consecutive steps of a fabrication process thereof according to a second embodiment of the present invention.
Figure 2B:
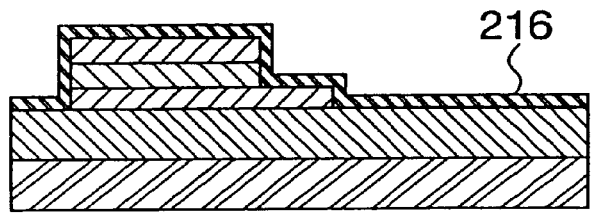

Referring to FIGS. 2A to 2E, there is shown a process according to a second embodiment of the present invention. A 100 nm-thick first $SiO_2$ film 212 was formed on a GaAs substrate 211 by LPCVD, followed by formation of a bottom electrode 213 having a Pt(70 nm)/Ti(20 nm)/Pt(70 nm)/Ti (20 nm) laminate, a 200 nm-thick high-permittivity film 214 made of $SrTiO_3$, and a 70 nm-thick top electrode 215 made of Pt by using sputtering and subsequent consecutive ion-milling to form a MIM capacitor, as shown in FIG. 2A. The substrate temperature during formation of $SrTiO_3$ film was 450° C. A 100 nm-thick second $SiO_2$ film 216 was then formed on the MIM capacitor by using APCVD, as shown in FIG. 2B.

Figure 2C:
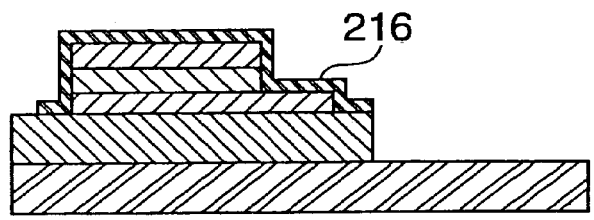
Figure 2D:
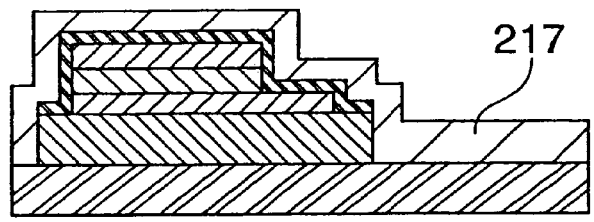
Figure 2E:
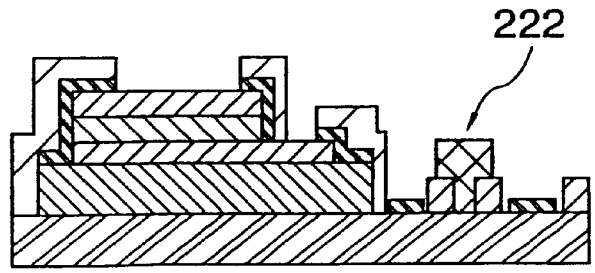

The first and the second $SiO_2$ films 216 and 212 were then removed by selective etching to leave the $SiO_2$ films 216 and 212 covering and underlying, respectively, the MIM capacitor, the $SiO_2$ films 216 and 212 having edges protruding 5 μm from the outer edge of the bottom electrode 213, as shown in FIG. 2C. Subsequently, the resultant wafer was surface-treated by using a hydrochloric acid solution ($HCl:H_2O$=1:1), followed by formation of a process oxide film 217 by using LPCVD, as shown in FIG. 2D. Thereafter, gate electrode and ohmic contacts were formed while patterning the process oxide film 217 to form a FET 222, as shown in FIG. 2E.

The resultant FET was subjected to measurement of drain current characteristic with respect to drain voltage. In the measurement, the FET according to the present embodiment exhibited excellent characteristics of a maximum drain current density at 630 mA/mm and a maximum drain conductance at 340 mS/mm. This is considered due to the fact that $SiO_2$ film covering the MIM capacitor prevented Sr element or impurity elements from eluding from the $SrTiO_3$ film 214 to contaminate the FET regions during the pretreatment before formation of the process oxide film 117. The present embodiment achieved advantages similar to those in the first embodiment. In addition, in the present embodiment, the insulating film underlying the MIM capacitor prevents the substrate leakage current caused by formation of the $SrTiO_3$ film, thereby assuring excellent insulation between the active elements. Moreover, since the bottom electrode is not in contact with the substrate, the circuit design choice is not limited to a grounded capacitor. In the present embodiment, the substrate and the high-permittivity film may be replaced by those as recited in connection with the first embodiment to obtain similar advantages.

Figure 3A:
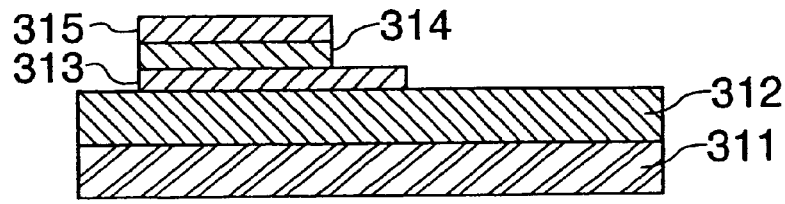
FIGS. 3A to 3E are cross-sectional views of a semiconductor device in consecutive steps of a fabrication process thereof according to a third embodiment of the present invention.
Figure 3B:
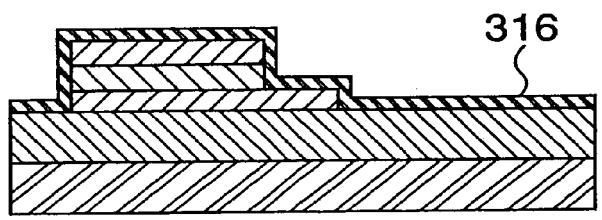

Referring to FIGS. 3A to 3E, there is shown a process according to a third embodiment of the present invention. A 100 nm-thick $SiO_2$ film 312 was formed on a GaAs substrate 311 by LPCVD, followed by formation of a bottom electrode 313 having a Pt(70 nm)/Ti(20 nm)/Pt(70 nm)/Ti(20 nm) laminate, a 300 nm-thick high-permittivity film 314 made of $SrTiO_3$, and a 70 nm-thick top electrode 315 made of Pt by using sputtering and ion-milling techniques to form a MIM capacitor, as shown in FIG. 3A. The substrate temperature during formation of $SrTiO_3$ film was 450° C. A 100 nm-thick $SiN_x$ film 316 was then formed on the MIM capacitor by using plasma enhanced CVD (PECVD), as shown in FIG. 3B.

Figure 3C:
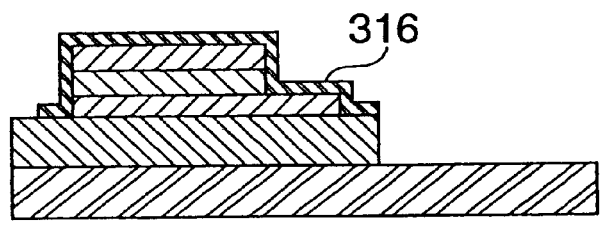
Figure 3D:
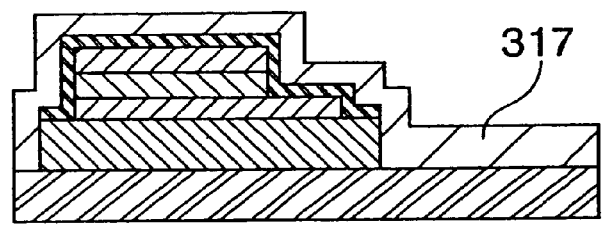
Figure 3E:
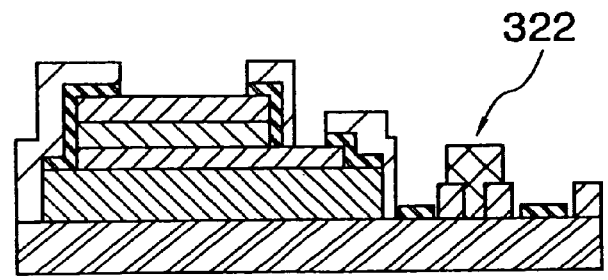

The $SiN_x$ film 316 and the $SiO_2$ film 312 were then removed by selective wet etching to leave the $SiN_x$ film 316 and the $SiO_2$ films 312 covering and underlying, respectively, the MIM capacitor, the $SiN_x$ and $SiO_2$ films having edges 5 m protruding from the outer edge of the bottom electrode 313, as shown in FIG. 3C. Subsequently, the surface of the resultant wafer was treated by using a hydrochloric acid solution ($HCl:H_2O$=1:1), followed by formation of a process oxide film 317 by using LPCVD, as shown in FIG. 3D. Thereafter, gate electrode and ohmic contacts were formed by using the process oxide film 317 to form a FET 322, as shown in FIG. 3E.

The resultant FET was subjected to measurement of drain current characteristic with respect to drain voltage. In the measurement, the FET according to the present embodiment exhibited excellent characteristics of a maximum drain current density at 630 mA/mm and a maximum drain conductance at 340 mS/mm. This is considered due to the fact that SiNx film 316 covering the MIM capacitor prevented Sr element or impurity elements from eluding from the $SrTiO_3$ film to contaminate the FET regions during the pretreatment using the hydrochloric acid solution for formation of the process oxide film 317. The selective etching of the $SiN_x$ film in the present invention to expose the substrate surface alleviated the stress applied to the substrate surface compared to the case wherein the $SiN_x$ film was not selectively removed. The GaAs substrate may be replaced by InP or Si substrate, and the $SrTiO_3$ film may be replaced by $BaTiO_3$ or $PbTiO_3$ film to obtain similar results.

Figure 4A:
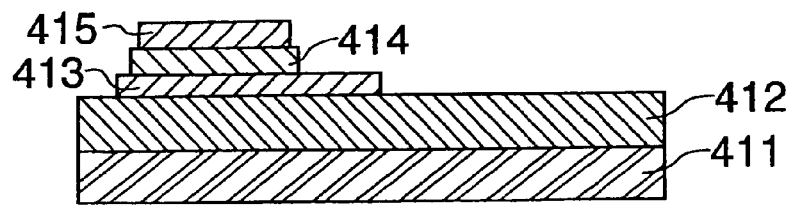
FIGS. 4A to 4E are cross-sectional views of a semiconductor device in consecutive steps of a fabrication process thereof according to a fourth embodiment of the present invention.
Figure 4B:
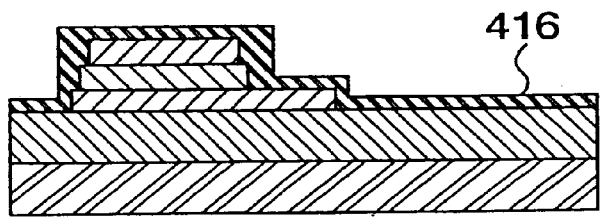

Referring to FIGS. 4A to 4E, there is shown a process according to a fourth embodiment of the present invention. A 100 nm-thick $SiO_2$ film 412 was formed on a GaAs substrate 411 by LPCVD, followed by sputtering of a Pt(70 nm)/Ti(20 nm)/Pt(70 nm)/Ti(20 nm) laminate, a 300 nm thick high-permittivity film 414 made of $(Sr_{0.5},Ba_{0.5})TiO_3$, and a 70 nm-thick Pt film 415. After the top Pt film 415 was patterned by ion-milling to form a top electrode 415, the $(Sr_{0.5},Ba_{0.5})TiO_3$ film 414 was selectively removed by a wet etching using fluorine-nitric acid. Thereafter, the bottom Pt(70 nm)/Ti(20 nm)/Pt(70 nm)/Ti(20 nm) laminate is patterned by ion-milling to form a bottom electrode .413, thereby forming a MIM capacitor, as shown in FIG. 4A. The substrate temperature during formation of $(Sr_{0.5},Ba_{0.5})TiO_3$ film 414 was 550° C. A 100 nm-thick $SiN_x$ film 416 was then formed on the MIM capacitor by using PECVD, as shown in FIG. 4B.

Figure 4C:
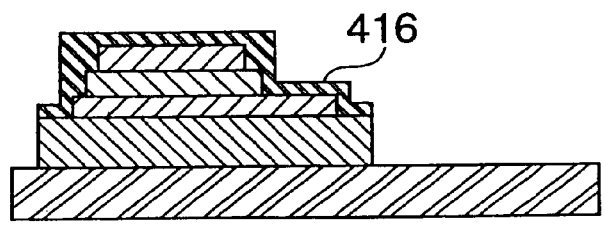
Figure 4D:
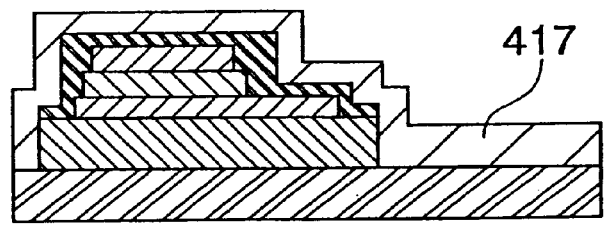
Figure 4E:
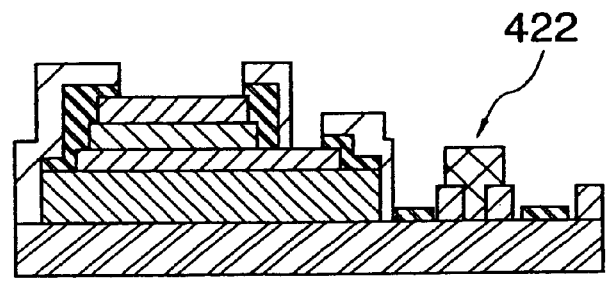

The $SiN_x$ film 416 and the $SiO_2$ film 412 were then removed by selective etching using a photoresist film as a mask to leave the SiNx film 416 covering the MIM capacitor and the $SiO_2$ film 412 underlying the MIM capacitor, both the remaining films 416 and 412 having edges protruding 5 $\mu$m from the outer edge of the bottom electrode 413, as shown in FIG. 4C. Subsequently, the surface of the resultant wafer is treated by using a hydrochloric acid solution ($HCl:H_2O=1:1$); followed by formation of a process oxide film 417 by using LPCVD, as shown in FIG. 3D. Thereafter, gate electrode and ohmic contacts were formed while patterning the process oxide film 417 to form a FET 422, as shown in FIG. 4E.

The resultant FET was subjected to measurement of drain current characteristic with respect to drain voltage. In the measurement, the FET according to the present embodiment had excellent characteristics of a maximum drain current density at 630 mA/mm and a maximum drain conductance at 340 mS/mm. This is considered due to the fact that the $SiN_x$ film 416 covering the MIM capacitor prevented Sr element or impurity elements from eluding from the $(Sr0.5, Ba_{0.5})TiO_3$ film 414 to contaminate the FET regions during the pretreatment before formation of the process oxide film 417. In addition to advantages similar to those in the first embodiment, the selective etching of the $SiN_x$ film 416 to expose the substrate surface alleviated the stress applied to the substrate surface compared to the case wherein the $SiN_x$ film 416 was not selectively removed. Moreover, the underlying $SiO_2$ film 412 provided advantages similar to those in the second embodiment. The GaAs substrate may be replaced by InP or Si substrate, and the high-permittivity film may be made of $Pb(Zr_x,Ti_{1-x})O_3$ or $SrBi_2Ti_{2-x}Nb_xO_9$ film.

Figure 5A:
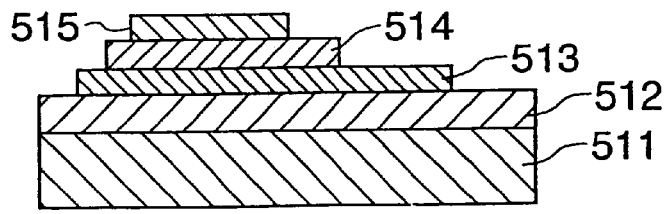
FIGS. 5A to 5E are cross-sectional views of a semiconductor device in consecutive steps of a fabrication process thereof according to a fifth embodiment of the present invention.
Figure 5B:
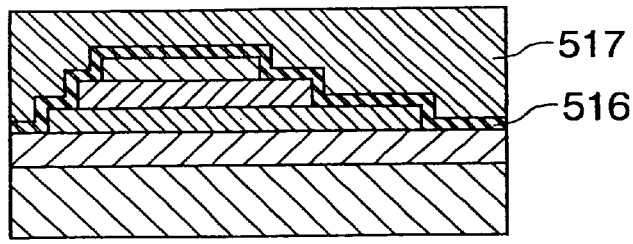
Figure 5C:
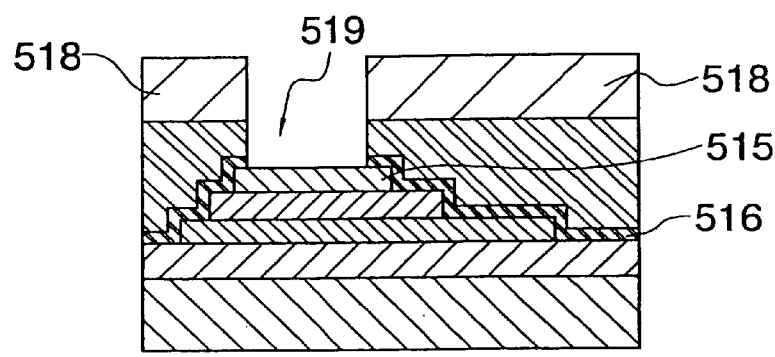
Figure 5D:
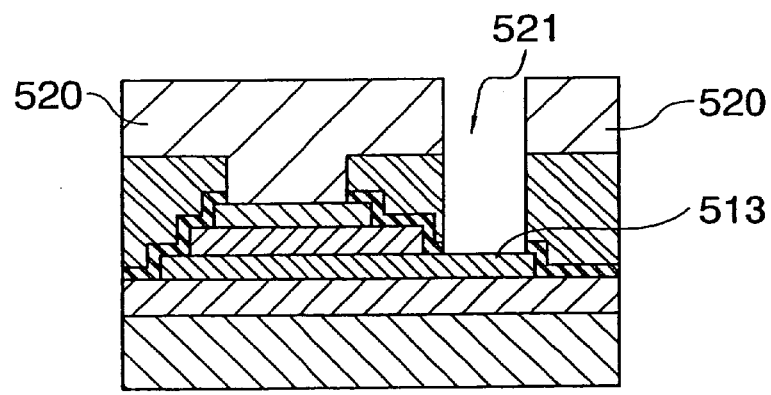

Referring to FIGS. 5A to 5E, there is shown a process according to a fifth embodiment of the present invention. A 100 nm-thick $SiO_2$ film 512 was formed on a GaAs substrate 511 by LPCVD, followed by formation of a bottom electrode 513 having a Pt(70 nm)/Ti(20 nm)/Pt(70 nm)/Ti(20 nm) laminate, a 300 nm-thick high-permittivity film 514 made of $SrTiO_3$, and a 100 nm-thick top electrode 515 made of Pt by using sputtering and subsequent consecutive ion-milling to form a MIM capacitor, as shown in FIG. 5A. The substrate temperature during formation of $SrTiO_3$ film was 450° C. A 250 nm-thick $SiN_x$ film 516 was then formed on the MIM capacitor by using PECVD, followed by formation of a $SiO_2$ film 517 by PECVD and etch-back thereof for planarization, as shown in FIG. 5B.

Figure 5E:
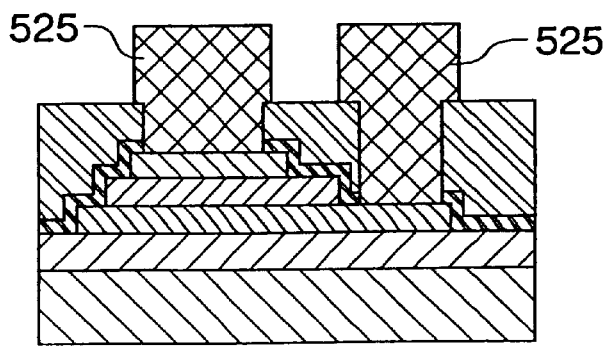

Subsequently, a through-hole 519 was formed in the $SiO_2$ film 517 and the $SiN_x$ film 516 to expose the top electrode 515 by a RIE technique using a mixture of $CHF_3$ and $H_2$ gases and a photoresist film 518 as a mask. The etching time was 36 minutes, which corresponded to a 30% over-etching, i.e., 130% of the normal etching time generally required from the top $SiO_2$ film 517 to the top electrode 515. Thereafter, another through-hole 521 was formed in the $SiO_2$ film 517 and $SiN_x$ film 516 to expose the bottom electrode 513 by a RIE technique using a mixture of $CHF_3$ and $H_2$ gases and another photoresist film 520 as a mask, to thereby form the structure of FIG. 5D. The etching time was 80 minutes, which corresponded to 100% over-etching, i.e., 200% of the normal etching time generally required from the top $SiO_2$ film 517 to the bottom electrode 513. An interconnect layer 525 plated with gold was then formed on the $SiO_2$ film 517 and in the through-holes 519 and 521, as shown in FIG. 5E.

Figure 9:
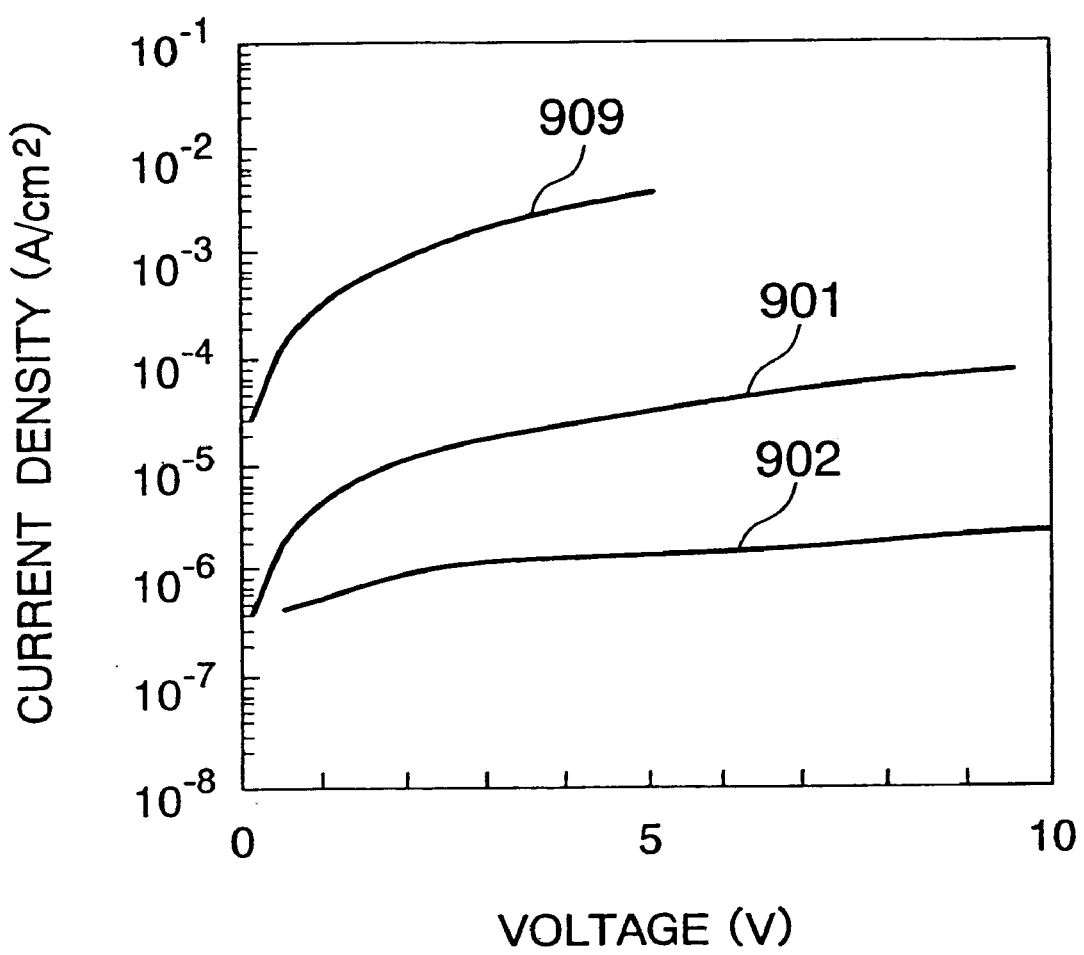
FIG. 9 is a graph of leakage current density plotted against applied voltage.

The resultant MIM capacitor was subjected to measurement of current-voltage characteristic of the MIM capacitor, the result of which is illustrated by a curve 901 shown in FIG. 9. The leakage current density of the MIM capacitor was about $3.6 \times 10^{-5}$ $A/cm^2$ at an applied voltage of 5 volts. A conventional MIM capacitor, having through-holes formed by a single step for formation of both the top and bottom electrodes, had a current-voltage characteristic illustrated by a curve 909 shown in FIG. 9, wherein the leakage current density was $4.0 \times 10^{-3}$ $A/cm^2$ at 5 volts which was about 100 times higher compared to the leakage current density of the present embodiment. The substrate and high-permittivity film may be replaced by those as recited in connection with the first embodiment.

Figure 6A:
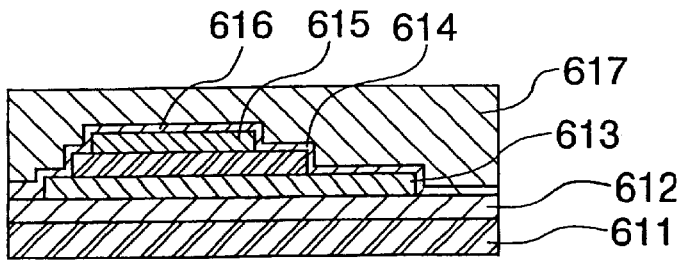
FIGS. 6A to 6E are cross-sectional views of a semiconductor device in consecutive steps of a fabrication process thereof according to a sixth embodiment of the present invention.

Referring to FIGS. 6A to 6E, there is shown a process according to a sixth embodiment of the present invention. A 100 nm-thick $SiO_2$ film 612 was formed on a GaAs substrate 611 by LPCVD, followed by formation of a bottom electrode 613 having a Pt(70 nm)/Ti(20 nm)/Pt(70 nm)/Ti(20 nm) laminate, a 300 nm-thick high-permittivity film 614 made of $SrTiO_3$, and a 70 nm-thick top electrode 615 made of Pt by using sputtering and subsequent consecutive ion-milling to form a MIM capacitor. The substrate temperature during formation of $SrTiO_3$ film 614 was 450° C. A 250 nm-thick $SiN_x$ film 616 was then formed on the MIM capacitor by using PECVD, followed by formation of a $SiO_2$ film 617 by PECVD and subsequent etch-back thereof for planarization, as shown in FIG. 6A.

Figure 6B:
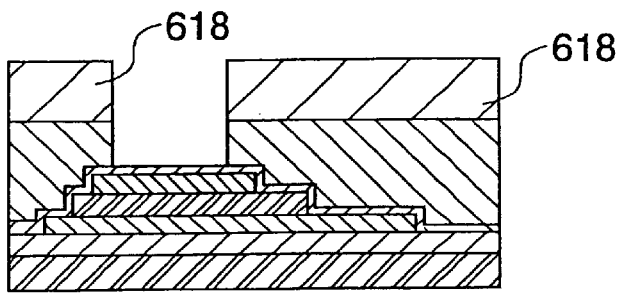
Figure 6C:
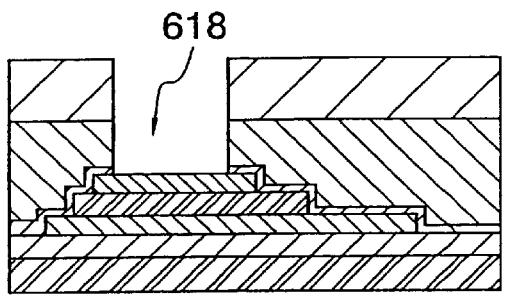

Subsequently, a through-hole 619 was formed in the $SiO_2$ film 617 and the $SiN_x$ film 616 by using a photoresist film 618 as a mask to expose the top electrode 615. In this process, $SiO_2$ film 617 was first selectively etched by a reducing gas of $CHF_3$ and $H_2$, as shown in FIG. 6B, followed by selective etching of the SiN film 616 by using an oxidizing gas of $CF_4$ and $O_2$, as shown in FIG. 6C.

Figure 6D:
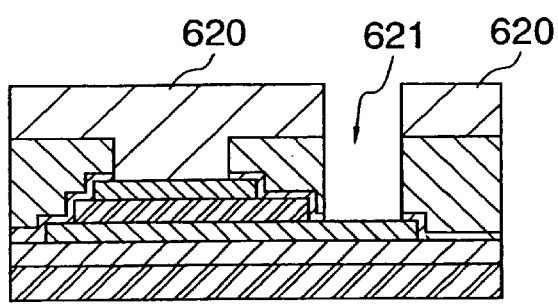
Figure 6E:
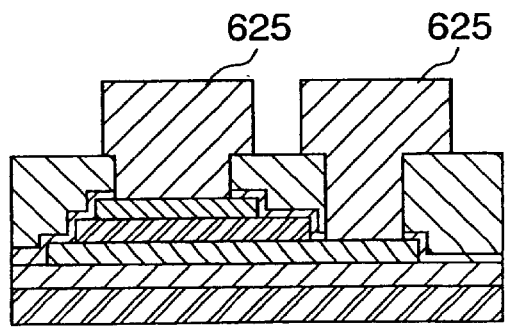

Thereafter, another through-hole 621 was formed in the $SiO_2$ film 617 and $SiN_x$ film 616 to expose the bottom electrode 613 by using a mixture of $CHF_3$ and $H_2$ gases and another photoresist film 620 as a mask, to thereby form the structure of FIG. 6D. In the above process, the damage to the $SrTiO_3$ film 614 is reduced due to the absence of the reducing gas during etching of the $SiN_x$ film 616 for exposing the surface of the top electrode 615. An interconnect layer 625 plated with gold was then formed on the $SiO_2$ film 617 and in the through-holes 619 and 621, as shown in FIG. 6E.

The resultant MIM capacitor was subjected to measurement of current-voltage characteristic, the result of which is illustrated by a curve 902 shown in FIG. 9. The leakage current density of the MIM capacitor was about $1.6 \times 10^{-6}$ $A/cm^2$ at an applied voltage of 5 volts, which was about 1/1000 of the leakage current density of $4.0 \times 10^{-3}$/cm$^2$ at 5 volts in the conventional technique, proving the advantage of the present embodiment over the conventional technique.

The substrate and high-permittivity film may be replaced by those as recited in connection with the first embodiment.

Figure 7:
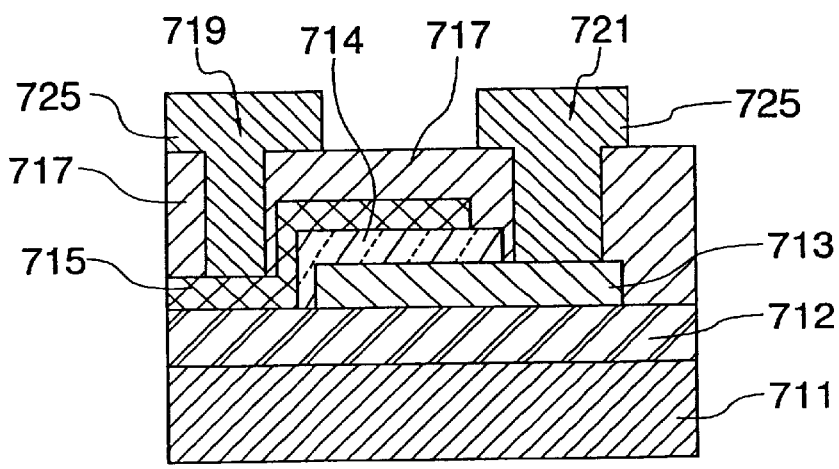
FIG. 7 is a cross-sectional view of a semiconductor device fabricated by a method according to a seventh embodiment of the present invention.

Referring to FIG. 7, there is shown a semiconductor device manufactured by a method according to a seventh embodiment of the present invention. The semiconductor device was fabricated as follows. First, a 100 nm-thick SiO$_2$ film 712 was formed on a GaAs substrate 711 by a LPCVD technique, followed by sputtering and milling steps to form a bottom electrode 713 made of a Pt(70 nm)/Ti(20 nm)/Pt(70 nm)/Ti(20 nm) laminate. A 200 nm-thick SrTiO$_3$ film 714 and a 70 nm-thick top electrode 715 made of Pt were then formed by sputtering and milling techniques, while maintaining the substrate 711 at a temperature of 450° C., to form a MIM capacitor. A pad portion of the top electrode 715 was formed on the SiO$_2$ film 712 in the step of forming the top electrode portion formed right above the capacitor insulator film 714. Thereafter, another SiO$_2$ 717 was formed as an interlayer dielectric film by PECVD, followed by etch-back thereof for planarization. Through-holes 719 and 721 were then formed in a single step using a photoresist film 718 as a mask and a reactive gas of CHF$_3$ and H$_2$. A metallic electrode 825 plated with gold was then formed on the SiO$_2$ film 717 and in the through-holes 719 and 721, thereby forming the structure of FIG. 7.

In the present embodiment, since the through-hole 719 for the top electrode 715 was not disposed right above the MIM capacitor, the reducing gas used in the step of formation of the through-hole 719 did not affect the leakage current characteristic of the SrTiO$_3$ film 714 in the MIM capacitor. The MIM capacitor of the present embodiment was subjected to measurement of the leakage current characteristic, which exhibited a leakage current density of $1.6 \times 10^{-6}$ A/cm$^2$ at 5 volts which was lower than the conventional technique by 1/1000. The substrate and high-permittivity film may be replaced by those as recited in connection with the first embodiment.

Figure 8:
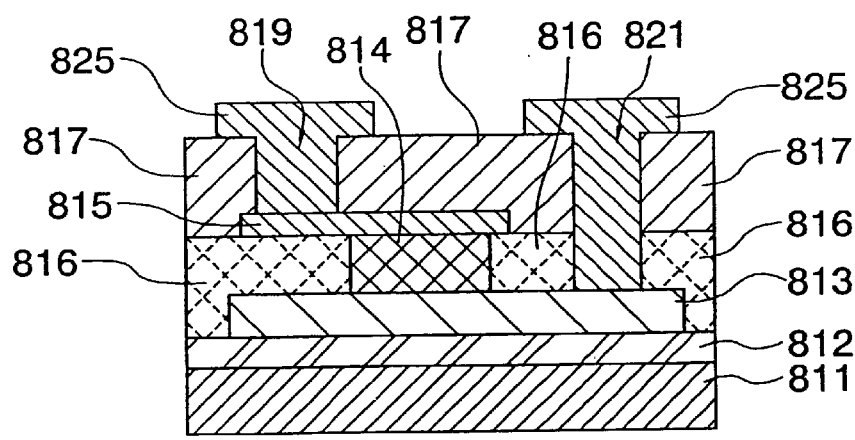
FIG. 8 is a cross-sectional view of a semiconductor device fabricated by a method according to an eighth embodiment of the present invention.

Referring to FIG. 8, there is shown a semiconductor device fabricated by a process according an eighth embodiment of the present invention. The semiconductor device was fabricated as follows. First, a 100 nm-thick SiO$_2$ film 812 was formed on a GaAs substrate 811 by a LPCVD technique, followed by sputtering and subsequent milling to form a bottom electrode 813 made of a Pt(70 nm)/Ti(20 nm)/Pt(70 nm)/Ti(20 nm) laminate. A 300 nm thick SrTiO$_3$ film 814 was then formed by sputtering and subjected to milling, while maintaining the substrate temperature at 450° C.

A 300 nm-thick first interlayer dielectric film 816 was then formed by LPCVD and subjected to patterning to expose the SrTiO$_3$ film 814, the top of which was flush with the top of the first dielectric interlayer dielectric film 816. A 100 nm-thick top electrode was formed thereon by sputtering and then subjected to milling. A pad integral with the top electrode 815 was formed on the interlayer dielectric film 816 in the step of forming the top electrode 815. A second interlayer dielectric film 817 was then formed by PECVD, followed by etch-back thereof for planarization.

Through-holes 819 and 821 were then formed in a single step using a photoresist film 818 as a mask and a reactive gas of CHF$_3$ and H$_2$. A metallic electrode 825 plated with gold is then formed on the SiO$_2$ film 817 and in the through-holes 819 and 821, thereby completing the structure of FIG. 8.

In the present embodiment, since the through-hole 819 for the top electrode 815 is not disposed right above the MIM capacitor, the reducing gas or reactive gas used in the step of formation of the through-hole for the top electrode 815 did not affect the leakage current characteristic of the SrTiO$_3$ film in the MIM capacitor. The MIM capacitor of the present embodiment was subjected to measurement of leakage current characteristic, which exhibited a leakage current density of $1.6 \times 10^{-2}$ A/cm$^2$ at 5 volts lower than the conventional technique by 1/1000. The substrate and high-permittivity film may be replaced by those as recited in connection with the first embodiment.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising a substrate, a metal-insulator-metal (MIM) capacitor overlying said substrate and having a bottom electrode, a capacitor insulator film and a top electrode, a first dielectric film covering said MIM capacitor and having an edge protruding from an edge of said bottom electrode, a second dielectric film formed on said first dielectric film and said substrate, said second dielectric film being made from a different material than said first dielectric film and having a first opening for exposing a portion of said substrate, and a transistor having an electrode in contact with said portion of said substrate through said first opening.

2. A semiconductor device as defined in claim 1, further comprising a third dielectric film disposed between said bottom electrode and said substrate, said third dielectric film having an edge substantially flush with said edge of said first dielectric film.

3. A semiconductor device as defined in claim 1, wherein said first dielectric film is made of SiNx.

4. A semiconductor device, comprising:
    a substrate;
    a metal-insulator-metal (MIM) capacitor disposed over said substrate, said MIM capacitor having a bottom electrode, a high permittivity layer, and a top electrode;
    a first dielectric film at least partially covering said MIM capacitor and having an edge protruding from an edge of said bottom electrode;
    a second dielectric film disposed on said first dielectric film, said second dielectric film being made from a different material than said first dielectric film;
    a first opening formed in said first and second dielectric films that exposes a portion of said top electrode; and
    a second opening formed in said first and second dielectric films that exposes a portion of said bottom electrode.

5. The semiconductor device of claim 4, further comprising:
    a third dielectric film disposed between said substrate and said MIM capacitor.

6. The semiconductor device of claim 4, wherein said first dielectric film includes a material selected from the group consisting of at least one of: SiO$_2$ and SiN$_x$.

7. The semiconductor device of claim 4 further comprising:
    an FET transistor disposed on said substrate.

8. The semiconductor device of claim 4, wherein said substrate includes at least one of:
    GaAs and InP.

* * * * *